(12) United States Patent
Tung (10) Patent No.: US 6,239,000 B1
(45) Date of Patent: May 29, 2001

(54) METHOD OF FORMING ISOLATION STRUCTURE FOR ISOLATING HIGH VOLTAGE DEVICES

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/495,248

(22) Filed: Jan. 31, 2000

(51) Int. Cl.$^7$ .................................................. H01L 21/76
(52) U.S. Cl. ............................................ 438/425; 428/218
(58) Field of Search ..................................... 438/425, 218, 438/223, 224, 225, 353, 376, 427, 439, 549; 257/500

(56) References Cited

U.S. PATENT DOCUMENTS 5,716,886 * 2/1998 Wen ........................................ 438/299
6,140,193 * 10/2000 Tung ...................................... 438/306

* cited by examiner

Primary Examiner—David Nelms
Assistant Examiner—Quoc Hoang (57) ABSTRACT

A method of forming an isolation structure for isolating high voltage devices is described. A first p-well is formed in and on a substrate. Two field oxides are formed spaced apart from each other over the first p-well. A second p-well is formed in and on the first p-well, wherein the second p-well substantially surrounds and substantially being adjacent to the field oxides in the first p-well. A trench isolation is formed in and on the first p-well and between the field oxides, wherein the trench isolation is substantially deeper than the second p-well. A third p-well substantially surrounding and being adjacent to the trench isolation is formed in the first p-well.

19 Claims, 7 Drawing Sheets

METHOD OF FORMING ISOLATION STRUCTURE FOR ISOLATING HIGH VOLTAGE DEVICES

BACKGROUND OF THE INVENTION

1. Technical Field

The present invention relates to a semiconductor technology, and particularly to a method of forming an isolation structure.

2. Description of Related Art

Implementing electric circuits involves connecting isolated devices through specific paths. When fabricating silicon integrated circuits it must therefore be possible to isolate devices into the substrate from one another. These devices can subsequently be interconnected to create the specific circuit configurations desired. From this perspective, isolation technology is one of the critical aspects of fabricating integrated circuits.

A variety of techniques have been developed to isolate devices in integrated circuits. One reason is that different types of devices (e.g., high voltage devices and low voltage devices) have different isolation requirements. respectively. However, conventional technologies have the following drawbacks:

(1) The isolation field implant of a field oxide has a junction depth shallower than the well of a trench oxide, and has a light ion concentration, thereby having an unsatisfied isolating capability.

(2) A trench oxide has a well isolating devices better than the above field oxide well does, it is still not deep enough.

For this or other reasons, there is a need for a method to fabricate an isolation structure which satisfies those different requirements.

SUMMARY OF THE INVENTION

It is an object of this invention to provide a method of forming an isolation structure satisfies the need identified in the background section.

Other objects and advantages of this invention will become apparent to those of ordinary skill in the art having reference to the following specification in conjunction the drawings.

The present invention is directed to a method of forming an isolation structure. A substrate, for example, n-type substrate is provided. A first p-well is formed in and on the substrate. Two field oxides are formed spaced from each other over the p-well. A second p-well is formed in and on the first p-well, wherein the second p-well substantially surrounds the field oxides in the first p-well. A trench isolation is formed in and on the first p-well and between the field oxides, wherein the trench isolation is substantially deeper than the second p-well. A third p-well substantially surrounding the trench isolation in the first p-well.

In one preferred embodiment according to the present invention, the first p-well, the second p-well and the third p-well have ion concentrations of about 2E15-5E16 cm$^{-3}$, 8E15-5E17 cm$^{-3}$ and 6E16-8E17 cm$^{-3}$, respectively. Moreover, the formation of the second p-well preferably comprises forming a patterned nitride layer over the substrate, and then implanting second p-type ions by using the patterned nitride layer as a mask to form a second p-well in and on the first p-well, followed by removing the patterned nitride layer.

This present invention advantageously provides a first p-well to be served as a deep well junction isolation of an isolation region, and provides a second and a third p-wells which are more concentrated than the first p-well to be served as a junction isolation effectively isolating high voltage devices.

BRIEF DESCRIPTION OF THE DRAWINGS

The foregoing versions and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

FIG. 1A through FIG. 1K schematically illustrate cross-sectional views of a method of forming an isolation structure according to one preferred embodiment of this invention.

Figure 1A:
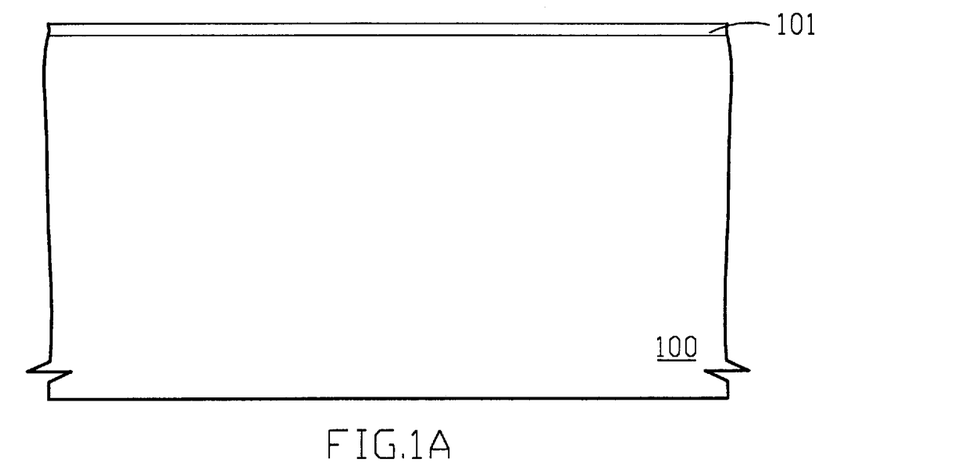
FIG. 1A through FIG. 1K schematically illustrate cross-sectional views of a method of forming an isolation structure according to one preferred embodiment of this invention.

Referring to FIG. 1A, a starting material, such as an n-type substrate or a p-type substrate 100, is provided. Noted that the type of the substrate 100 is not critical, so long as the subsequent formation of p-wells and n-wells can be done in and on the substrate 100. Generally speaking, the formation of the p-wells is done first, followed by the formation of the n-wells, if an n-type substrate is provided. On the contrary, the formation of the n-wells is done first, followed by the formation of the p-wells, if a p-type substrate is provided.

Still referring to FIG. 1A, an oxide layer 101 is formed over the substrate 100, to a thickness on the order of about 100–300 angstroms. The oxide layer 101 is formed by way of thermal oxidation, or alternatively by way of CVD for speeding.

Figure 1B:
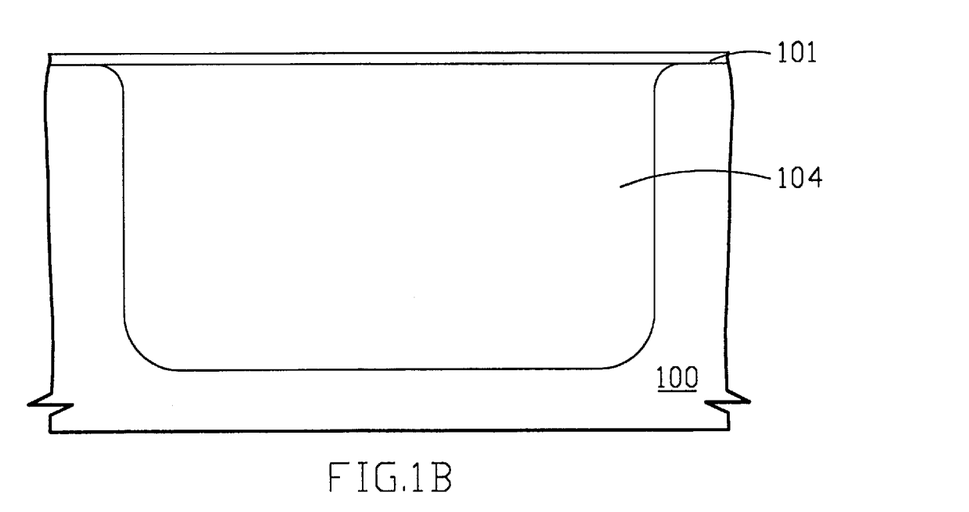

Referring to FIG. 1B, a mask layer (not shown) is applied and patterned over the substrate 100, to define the location at which a HV p-well (high-voltage p-well) 104 is to be formed in and on the substrate 100. To form the HV p-well 104, first p-type ions are implanted, through the oxide layer 101, into the substrate 100. After the implantation step has been performed, the mask layer and the oxide layer 101 may be sequentially removed. The first p-type ions, stemmed from BF$_2$, boron, or other gases, are implanted with a dose and an energy which are sufficient to result in an ion concentration on the order of about 2E15 to about 5E16 cm$^{-3}$ after the subsequent drive-in step has been performed. Following the HV p-well implant, a drive-in step is performed, at about 900 to about 1050 degrees Celsius, to active the implanted ions and to position the HV p-well 104 as desired.

Figure 1C:
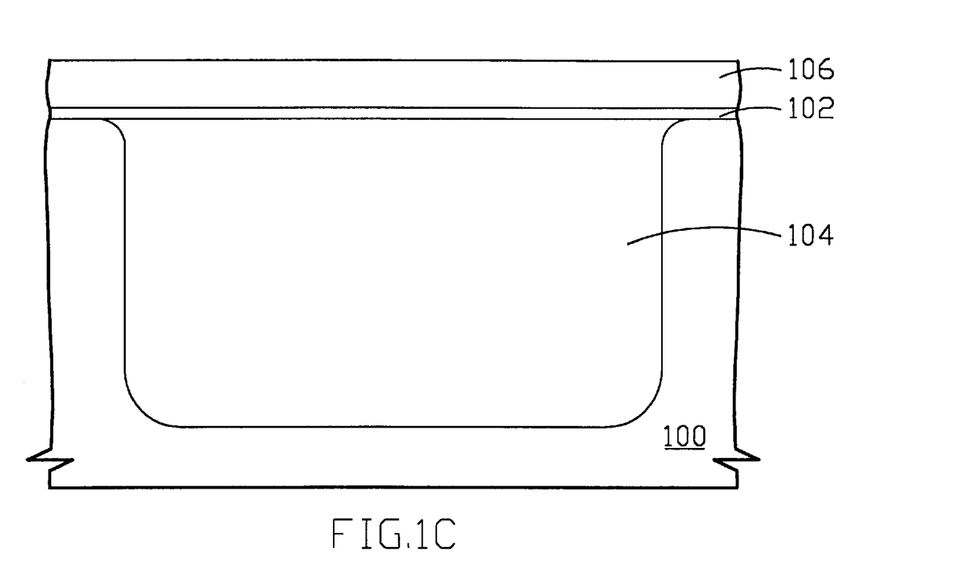

Referring to FIG. 1C, the oxide layer 101 (FIG. 1B) is removed, and a pad oxide layer 102 is then formed over the substrate 100, by way of, for example, thermal oxidation to a thickness of about 100 to about 300 angstroms, and preferably about 150 angstroms. A nitride layer, such as a silicon nitride layer 106 is then deposited over the substrate 100 by way of, for example, CVD to a thickness of about 1000 to about 2500 angstroms, and preferably about 1500 angstroms.

Figure 1D:
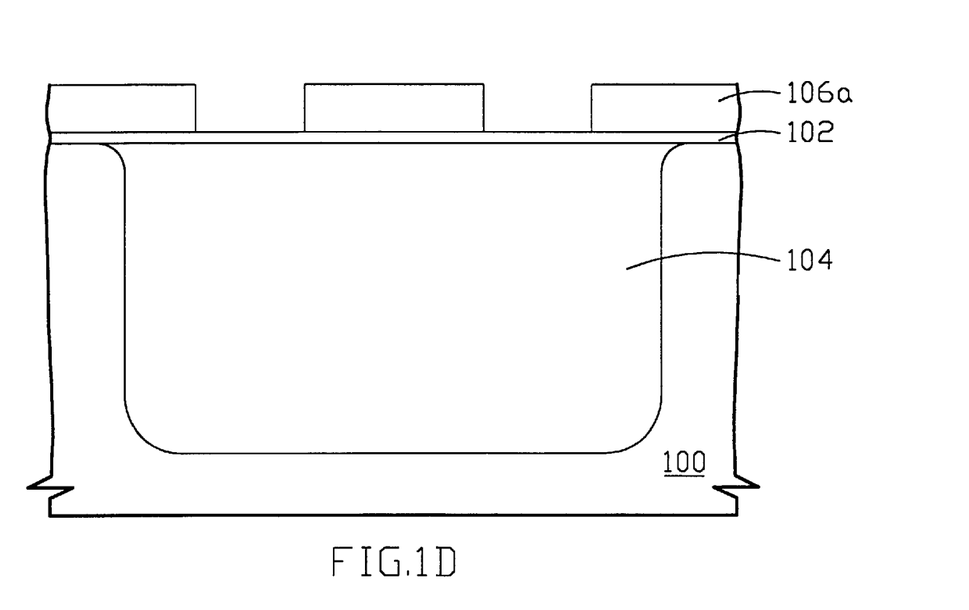

Referring to FIG. 1D, a photoresist layer (not shown) is applied, exposed and developed to define the locations at which field oxides are to be formed on the substrate 100. The silicon nitride layer 106 (FIG. 1C) is then etched at the locations of the substrate 100 by way of, for example, dry etching, to be a patterned silicon nitride layer 106a.

Figure 1E:
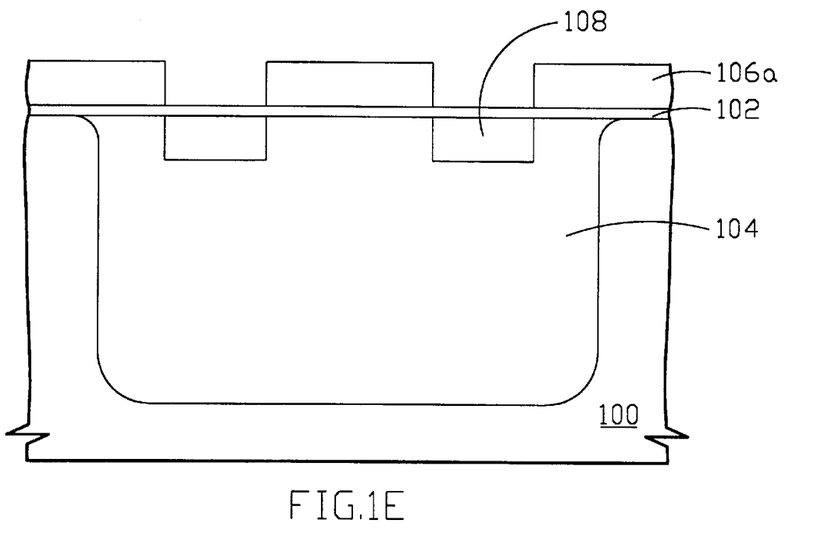

Referring to FIG. 1E, following the nitride etching step, second p-type ions are implanted in and on the HV p-well 104 to form a shallow LV p-well (low-voltage p-well) 108 by using the etched silicon nitride layer 106a as a mask. After the second p-type ions are implanted, the photoresist layer mentioned in the previous paragraph may be removed.

Figure 1F:
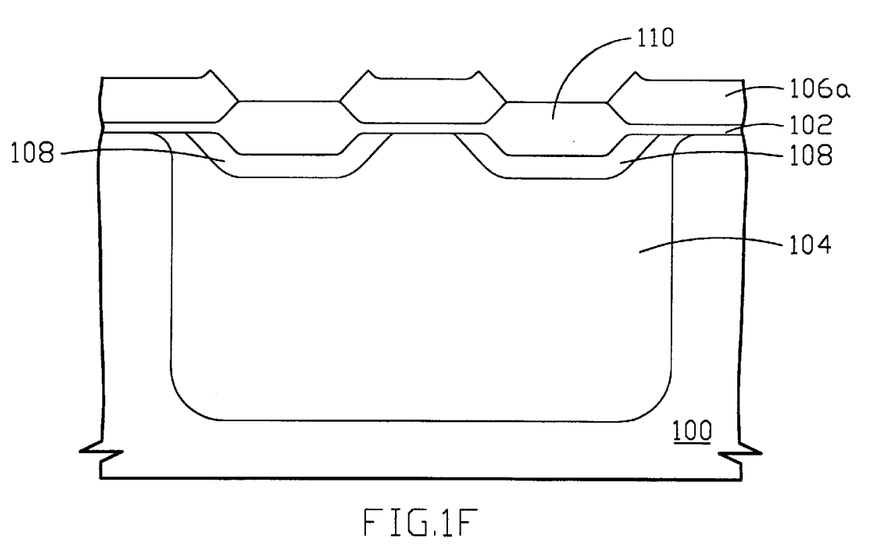

Referring to FIG. 1F, two field oxides 110 spaced from each other are thermally grown in and on the HV p-well, by way of, for example, wet oxidation to a thickness of about 3000 to about 10000 angstroms. During this wet oxidation step, the implanted second ions are annealed to position the shallow LV p-well 108, thereby substantially conforming to, surrounding, being underlying and adjacent to the field oxides 110 in the HV p-well 104.

Figure 1G:
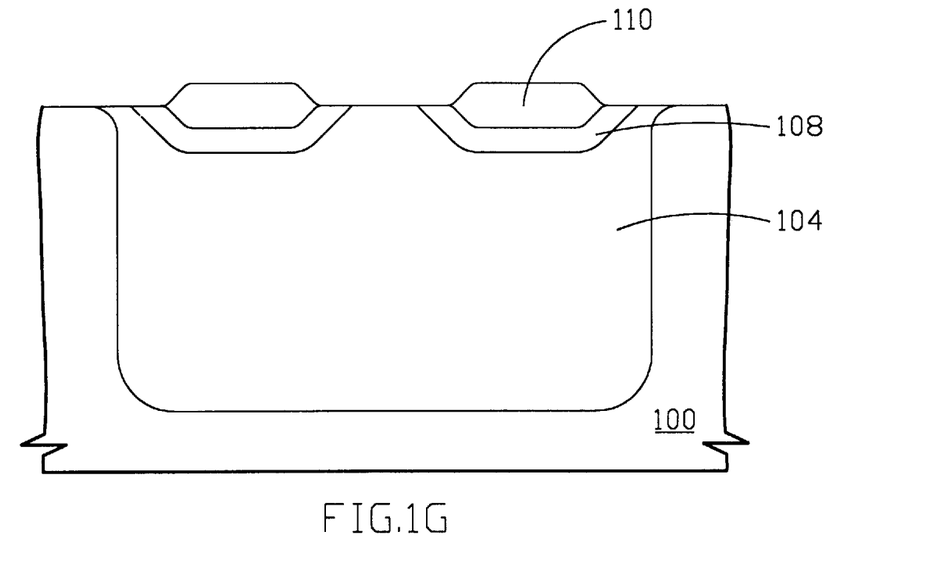

Referring to FIG. 1G, after the field oxides 110 have been formed, the silicon nitride layer 106a (FIG. 1F) and the pad oxide layer 102 are sequentially removed by way of, for example, wet etching.

Figure 1H:
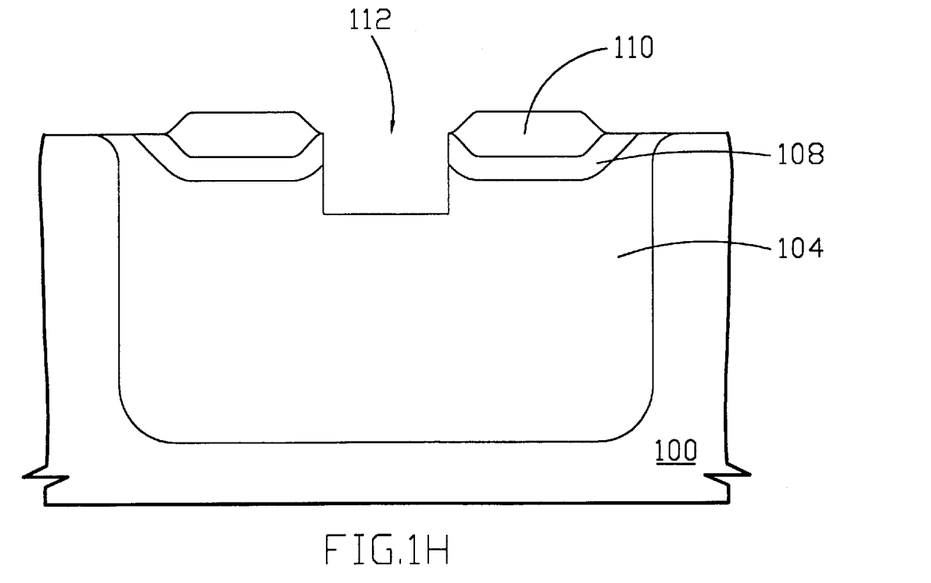

Referring to FIG. 1H, a mask layer (not shown) is applied, and patterned to expose the location at which a trench 112 is to be formed between the field oxides 110 in the HV p-well 104. The trench 112, formed at the exposed location of the substrate by way of, for example, plasma silicon etch, is preferably deeper than the shallow LV p-well 108, but is positioned in the HV p-well 104. After the trench 112 has been formed, the mask layer may be removed.

Figure 1I:
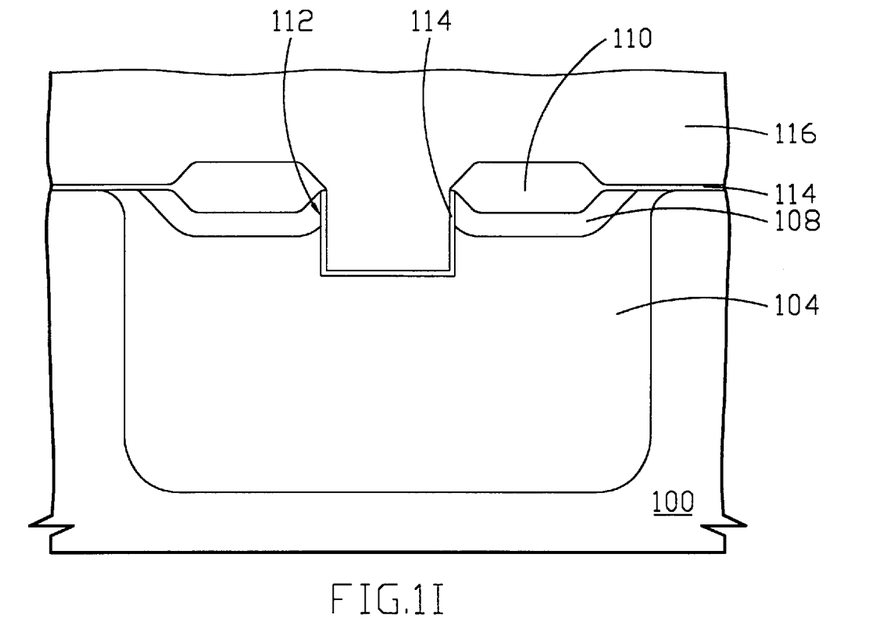

Referring to FIG. 1I, an oxide layer 114 substantially conforming to the substrate 100 is formed by way of, for example, thermal oxidation to a thickness of about 100–500 angstroms. To over-fill the trench 112, another oxide layer 116 is then formed over the substrate 100 by way of, for example, APCVD to a thickness of about 5000–9000 angstroms. Following the formation of the oxide layer 116, a densification step is performed at about 850 to about 1000 degrees Celsius, and preferably at about 900 degrees Celsius.

Figure 1J:
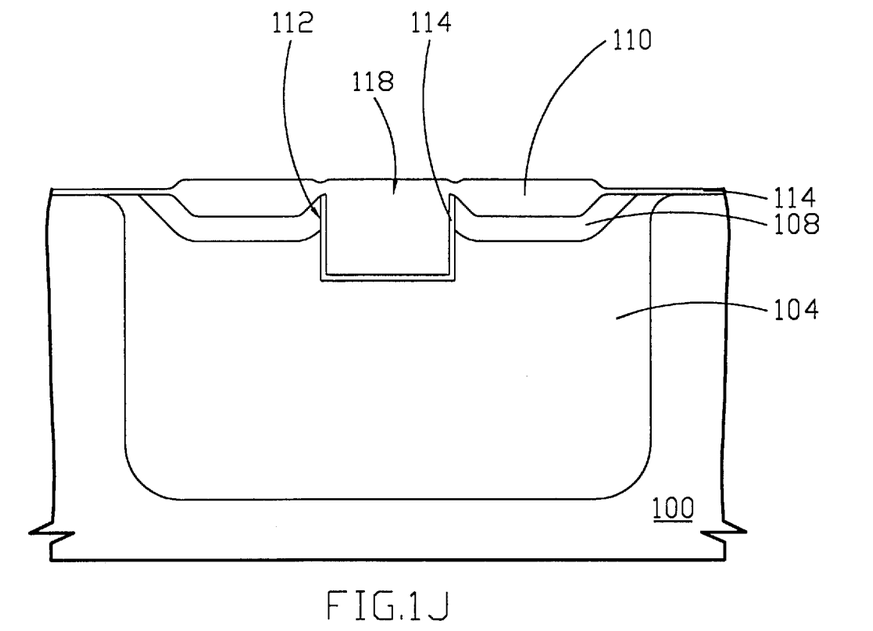

Referring to FIG. 1J, the oxide layer 116 (FIG. 1I) outside the trench 112 is removed by way of, for example, chemical-mechanical polishing, thereby leaving an oxide plug 118 in and on the HV p-well 104.

Figure 1K:
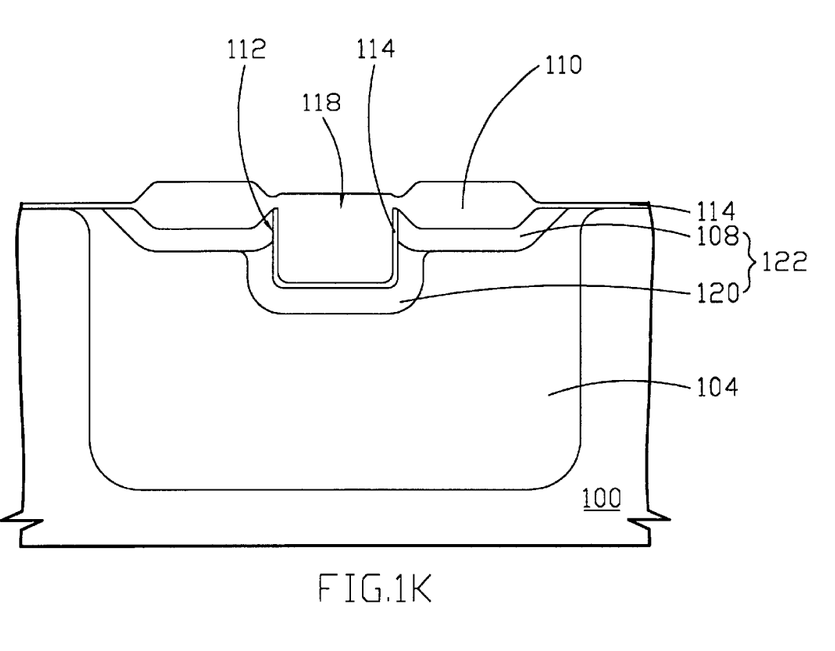

Referring to FIG. 1K, a deep LV p-well 120 is then formed to substantially surround and be adjacent to the trench 112 in the HV p-well 104. The deep LV p-well 120 can be formed by, for example, forming a pattern mask (not shown) over the substrate 100 to expose only the trench 112 and a portion of the substrate 100 substantially surrounding the trench 112, and then implanting third p-type ions into the trench 112 and the portion of the substrate 100, followed by removing the patterned mask. The third p-type ions, stemmed from $BF_2$, or other gases, are implanted with a dose and an energy which are sufficient to result in an ion concentration on the order of about 6E16 to about 8E17 $cm^{-3}$ after the subsequent annealing step has been performed. Following the deep LV p-well implant, an annealing step is performed, at about 850 to about 950 degrees Celsius, to active the implanted ions and to position the deep LV p-well 120 as desired. The deep LV p-well 120 and the shallow LV p-well 114 collectively serve as a LV p-well 122 for isolating low voltage devices. It is noted that the types of the LV well 122 and the HV well 104 are not limited to be p-type. In the contrary, they can alternatively be n-type without departing from the spirit of the present invention.

Figure 2:
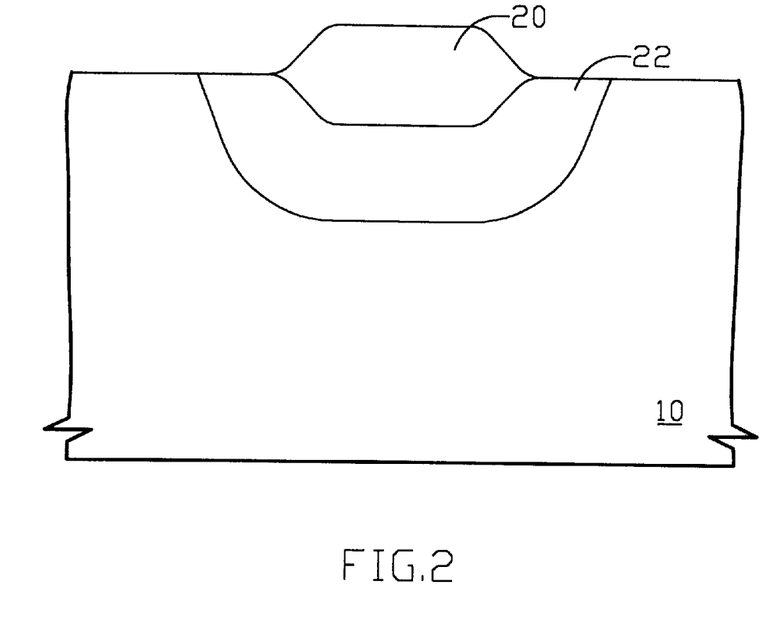
FIG. 2 is a cross-sectional view of another type of isolation structure.
Figure 3:
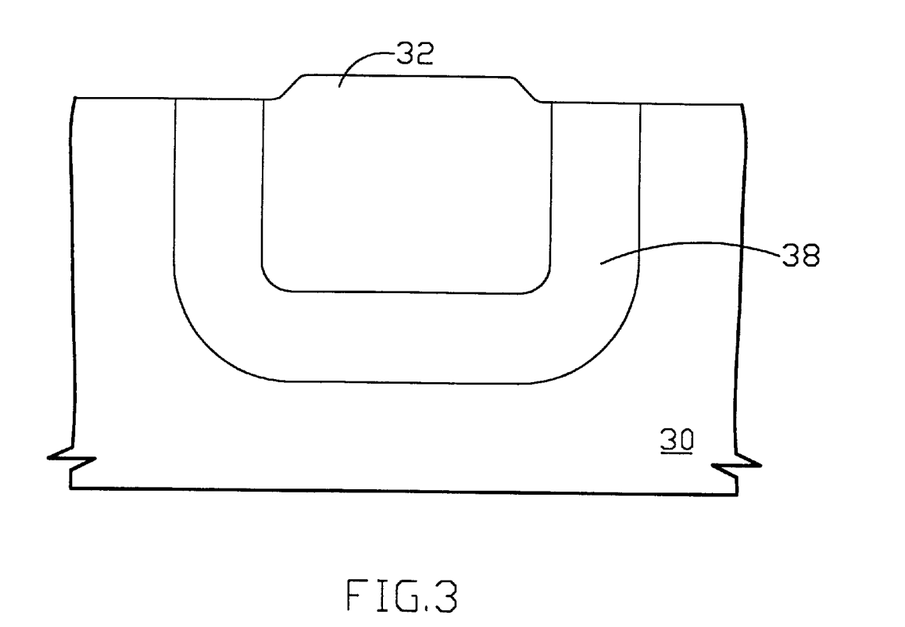
FIG. 3 is a cross-sectional view of still another type of isolation structure.

For comparison, another types of isolation structures are shown in FIG. 2 and FIG. 3, respectively. Referring to FIG. 2, a field oxide 20 and a well 22 substantially surrounding the field oxide 20 are formed in a substrate 10. The well 22 has a junction depth shallower than that of the invented LV p-well isolation 122 (FIG. 1K), and has an ion concentration less than that of the invented LV p-well 122, thereby having an unsatisfied isolating capability.

Referring to FIG. 3, the type of isolation structure has an oxide plug 32 and a well 38 surrounding the oxide plug 32 in a substrate 30. Although such a type of isolation structure has a well 38 isolating devices better than the above field oxide well 22 (FIG. 2) does, its junction depth is not satisfied as what the invented HV p-well 104 (FIG. 1K) be.

This present invention advantageously provides a HV well to be served as a deep well junction isolation of an isolation region, and provides a LV well which is more concentrated than the HV well to be served as a junction isolation effectively isolating high voltage devices.

Although specific embodiments have been illustrated and described, it will be obvious to those skilled in the art that various modifications may be made without departing from the spirit which is intended to be limited solely by the appended claims.

What is claimed is:

1. A method of forming an isolation structure, the method comprising:

providing a substrate;

forming a first p-well in and on the substrate;

forming two field oxides spaced from each other over the p-well;

forming a second p-well in and on the first p-well, wherein the second p-well partially surrounds the field oxides in the first p-well;

forming a trench isolation in and on the first p-well and between the field oxides, wherein the trench isolation is substantially deeper than the second p-well; and forming a third p-well substantially surrounding the trench isolation in the first p-well.

2. The method of claim 1, wherein the first p-well is formed by the implantation of first p-type ions into the substrate.

3. The method of claim 2, further comprising a drive-in step performed after the first p-type ions are implanted.

4. The method of claim 3, wherein the drive-in step is performed at about 900 degrees Celsius to about 1050 degrees Celsius.

5. The method of claim 1, wherein the first p-well has an ion concentration of about 2E15 to about 5E16 $cm^{-3}$.

6. The method of claim 1, wherein the formation of the second p-well comprises:

forming a patterned nitride layer over the substrate;

implanting second p-type ions by using the patterned nitride layer as a mask to form a second p-well in and on the first p-well; and removing the patterned nitride layer.

7. The method of claim 6, further comprising a step of forming a pad oxide layer over the substrate prior to the step of forming a patterned nitride layer.

8. The method of claim 7, further comprising a step of wet oxidation thermally growing the two field oxides, after the second p-type ions are implanted, and prior to the patterned nitride layer is removed.

9. The method of claim 1, wherein the second p-well has an ion concentration of about 8E15 to about 5E17 $cm^{-3}$.

10. The method of claim 1, further comprising an annealing step performed after the third p-well is formed.

11. The method of claim 10, wherein the annealing step is performed at about 850 degrees Celsius to about 950 degrees Celsius.

12. The method of claim 1, wherein the third p-well has an ion concentration of about 6E16 to about 8E17 cm$^{-3}$.

13. A method of forming an isolation structure for isolating devices, which method comprises the following steps:

providing a substrate;

forming a first well for isolating high voltage devices in and on the substrate;

forming two field oxides spaced from each other in and on the first well;

forming a second well substantially surrounding and being adjacent to the field oxides in the first well;

forming a trench isolation in and on the first well and between the field oxides, wherein the trench isolation is substantially deeper than the second well; and forming a third well substantially surrounding and being adjacent to the trench isolation in the first well, wherein the second and the third wells collectively serve as a well for isolating low voltage devices.

14. The method of claim 13, wherein the first well has an ion concentration of about 2E15 to about 5E16 cm$^{-3}$.

15. The method of claim 13, wherein the formation of the second well comprises:

forming a patterned nitride layer over the substrate;

implanting second ions by using the patterned nitride layer as a mask to form a second well in and on the first well; and removing the patterned nitride layer.

16. The method of claim 15, further comprising a step of forming a pad oxide layer over the substrate prior to the step of forming a patterned nitride layer.

17. The method of claim 16, further comprising a step of wet oxidation thermally growing the two field oxides, after the second ions are implanted and prior to the patterned nitride layer is removed.

18. The method of claim 13, wherein the second well has an ion concentration of about 8E15 to about 5E17 cm$^{-3}$.

19. The method of claim 13, wherein the third well has an ion concentration of about 6E16 to about 8E17 cm$^{-3}$.

* * * * *